(12) United States Patent
Tsai et al.

(10) Patent No.: US 6,331,480 B1
(45) Date of Patent: Dec. 18, 2001

(54) METHOD TO IMPROVE ADHESION BETWEEN AN OVERLYING OXIDE HARD MASK AND AN UNDERLYING LOW DIELECTRIC CONSTANT MATERIAL

(75) Inventors: Chia-Shiung Tsai, Hsin-Chu; Yao-Yi Cheng, Taipei; Hun-Jan Tao, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/252,469

(22) Filed: Feb. 18, 1999

(51) Int. Cl.$^7$ .................................................. H01L 21/4763
(52) U.S. Cl. .................................. 438/624; 438/637
(58) Field of Search ..................................... 438/622, 624, 438/637

(56) References Cited

U.S. PATENT DOCUMENTS

| | | | |
|---|---|---|---|
| 4,064,606 | * 12/1977 | Dunn | 29/25.42 |
| 4,732,801 | 3/1988 | Joshi | 428/198 |
| 4,894,351 | * 1/1990 | Batty | 438/624 |
| 5,110,712 | * 5/1992 | Kessler et al. | 430/312 |
| 5,136,682 | * 8/1992 | Moyer et al. | 385/141 |
| 5,288,519 | * 2/1994 | Baumgartner et al. | 427/304 |
| 5,332,694 | * 7/1994 | Suzuki | 438/624 |
| 5,407,529 | * 4/1995 | Homma | 156/643 |
| 5,451,642 | * 9/1995 | Abe et al. | 525/179 |
| 5,508,881 | * 4/1996 | Stevens | 361/305 |
| 5,554,567 | * 9/1996 | Wang | 438/624 |
| 5,556,806 | * 9/1996 | Pan et al. | 438/624 |
| 5,667,886 | * 9/1997 | Gough et al. | 428/331 |
| 5,744,865 | * 4/1998 | Jeng et al. | 257/750 |
| 5,759,906 | 6/1998 | Lou | 438/623 |
| 5,795,821 | * 8/1998 | Bacchetta et al. | 438/624 |
| 5,821,621 | * 10/1998 | Jeng | 257/759 |
| 5,854,130 | * 12/1998 | Yang et al. | 438/637 |
| 5,882,961 | * 3/1999 | Klingbeil, Jr. et al. | 438/180 |
| 5,923,074 | * 7/1999 | Jeng | 257/522 |
| 5,940,734 | * 8/1999 | Inoue | 438/781 |
| 6,159,661 | * 12/2000 | Huang et al. | 430/313 |
| 6,184,073 | * 2/2001 | Lage et al. | 438/238 |

FOREIGN PATENT DOCUMENTS

| | | | |
|---|---|---|---|
| 0 759 329 | * 2/1997 | (FR) | B05D/7/02 |
| 49-014728A | * 2/1974 | (JP) | D01F/6/62 |

* cited by examiner

Primary Examiner—Olik Chaudhuri
Assistant Examiner—Ginette Peralta
(74) Attorney, Agent, or Firm—George O. Saile; Stephen B. Ackerman (57) ABSTRACT

A method for improving the adhesion, between an overlying insulator layer, and an underlying low K layer, used for forming a composite layer, damascene mask pattern, wherein the damascene mask pattern is used as an interlevel dielectric layer, between metal interconnect structures, has been developed. A treatment, comprised of aqueous NH$_4$OH solutions, or of UV curing procedures, is performed on the top surface of the low K layer, prior to deposition of the overlying insulator layer. The treatment, resulting in a roughened top surface of the low K layer, allows removal of masking photoresist shapes, to be aggressively accomplished using wet strippers, without adhesion loss at the insulator—low K layer interface.

6 Claims, 6 Drawing Sheets

METHOD TO IMPROVE ADHESION BETWEEN AN OVERLYING OXIDE HARD MASK AND AN UNDERLYING LOW DIELECTRIC CONSTANT MATERIAL

BACKGROUND OF THE INVENTION

(1) Field of the Invention

The present invention relates to a method used to fabricate integrated circuits, on a semiconductor substrate, and more specifically to a method used to fabricate conductive wiring structures, embedded by low dielectric constant materials.

(2) Description of the Prior Art

To increase the performance of integrated circuits, fabricated on semiconductor substrates, in terms of metal conductivity, and insulator capacitance, copper is now being used to replace the higher resistivity aluminum, or tungsten, counterparts, for wiring applications, while low dielectric constant, (low K), materials, such as fluorine-doped silicon oxide glass, (FSG), hydrogen silsesquioxane, (HSQ), or aromatic hydrocarbons, with dielectric constants of about 2.5 to 3.5, are being used to replace chemically vapor deposited silicon oxide layer, which has a dielectric constant of about 4.0 to 4.5. The use of low K materials however, can present adhesion problems, when overlaid with higher dielectric constant materials, used as a hard mask for damascene type patterning procedures. For example a composite layer, damascene pattern, comprised of an overlying hard mask material, such as CVD silicon oxide, and an underlying low K material, such as FSG, is formed using conventional photolithographic and dry etching procedures. However the removal of the photoresist or polymer shape, used to define the damascene pattern, in the composite layer, can result in a loss of adhesion between the overlying hard mask, silicon oxide layer, and the underlying FSG layer, specifically during a wet stripping, or a wet clean up step, used after the photoresist stripping procedure. The loss of adhesion between these layers of the composite damascene mask can result in an inadequate, subsequent metal fill, exhibiting bridging to adjacent metal shapes, and leading to unwanted leakage and yield loss.

This invention will offer solutions for the loss of adhesion, between a silicon oxide hard mask, and an underlying low K material, that can occur during polymer, or photoresist removal procedures. Specific treatments, described in this invention, applied to a low K material, used as the underlying layer of a composite layer, damascene mask, or used as an interlevel dielectric layer, prior to the deposition of the hard mask material, results in an improvement of the adhesion between the overlying hard mask, and the underlying low K material. This invention will offer treatments featuring an $NH_4OH$ treatment, or a UV curing procedure, applied to an exposed low K material. Prior art, such as Joshi, in U.S. Pat. No. 4,732,801, describes a procedure to improve the adhesion of refractory metals, or silicon oxide layers, to underlying materials, but that prior art does not use the treatments described in this invention, nor does it describe the conditions needed for improving the adhesion of hard mask insulator layers, to underlying low K materials.

SUMMARY OF THE INVENTION

It is an object of this invention to create metal interconnect structures, and via plug structures, using a damascene procedure.

It is another object of this invention to use a low K material, as an underlying component of a composite layer, damascene mask pattern, comprised of an overlying hard mask layer, such as silicon oxide, and the underlying low K layer.

It is still another object of this invention to treat the underlying low K layer, of the composite layer, damascene mask pattern, with a $NH_4OH$ treatment, or with a UV curing procedure, prior to deposition of the overlying hard mask layer.

In accordance with the present invention a method of fabricating metal interconnect structures, using a damascene pattern mask, as an interlevel dielectric layer, and featuring improved adhesion between layers of chemical vapor deposited, (CVD), insulator layers, and underlying low K materials, has been developed. A first iteration comprises a metal plug structure, formed in a via hole in a first low K material, exposing an underlying metal interconnect structure. After deposition of a first CVD insulator layer a composite layer, damascene mask pattern, comprised of an overlying second CVD insulator layer, and an underlying second low K material, is formed on the top surface of the first CVD insulator layer. A $NH_4OH$, or a UV treatment, is performed to the second low K material, of the composite layer, damascene mask pattern, prior to deposition of the second CVD insulator, to provide adhesion improvements, needed specifically during the wet procedure, used to remove the photoresist shape, used to define the damascene mask pattern. After removal of the portion of first CVD insulator, exposed in the damascene mask pattern, exposing the top surface of the metal plug, an overlying metal interconnect structure is formed in the opening, in the damascene mask pattern.

A second iteration of this invention features the use of the $NH_4OH$, or UV treatment, applied to the first low K material, that is used as an interlevel dielectric layer, after the metal plug formation, and prior to deposition of the first CVD insulator layer. A damascene mask pattern, comprised of only a second CVD insulator layer, is next formed and used to accept an overlying interconnect structure.

A third iteration of this invention features the formation of a metal plug structure, formed in a first CVD insulator layer, contacting an underlying metal interconnect structure. A composite layer, damascene mask pattern, again comprised of an overlying second CVD insulator layer, and an underlying low K material, is used to accept the overlying metal interconnect structure, with the $NH_4OH$, or UV treatment performed prior to the deposition of the second CVD insulator layer.

BRIEF DESCRIPTION OF THE DRAWINGS

The object and other advantages of this invention are best described in the attached drawings that include.

DESCRIPTION OF THE PREFERRED EMBODIMENTS

The method used to improve the adhesion of an overlying CVD insulator layer, and an underlying low K material, specifically when used as a composite layer, for a damascene mask pattern, will now be described in detail. FIGS. 1–4, will describe the use of a damascene mask pattern, comprised of an overlying CVD insulator layer, and an underlying low K material, in which the adhesion between the layers of the composite damascene mask degraded during the removal of the photoresist shape, used to define the damascene mask pattern. An underlying metal interconnect structure 1, comprised of either a copper layer, a tungsten layer, or an aluminum based layer, is shown schematically in FIG. 1. Insulator layer 2, such as silicon nitride, is deposited on underlying metal interconnect structure 1, via low pressure chemical vapor deposition, (LPCVD), or plasma enhanced chemical vapor deposition, (PECVD), procedures, at a thickness between about 1000 to 2000 Angstroms. Insulator layer 2, is used as a diffusion barrier to prevent underlying copper, if used for underlying metal interconnect structure 1, from diffusing to surrounding regions. A low dielectric constant, (low K), material 3, is next formed, at a thickness between about 3000 to 5000 Angstroms, via chemical vapor deposition, (CVD), or spin-on procedures. Low K material 3, such as FSG, (fluorinated silicate glass), HSQ, or aromatic hydrocarbon, with dielectric constants between about 2.5 to 3.5, can be used for low K layer 3.

Figure 1:
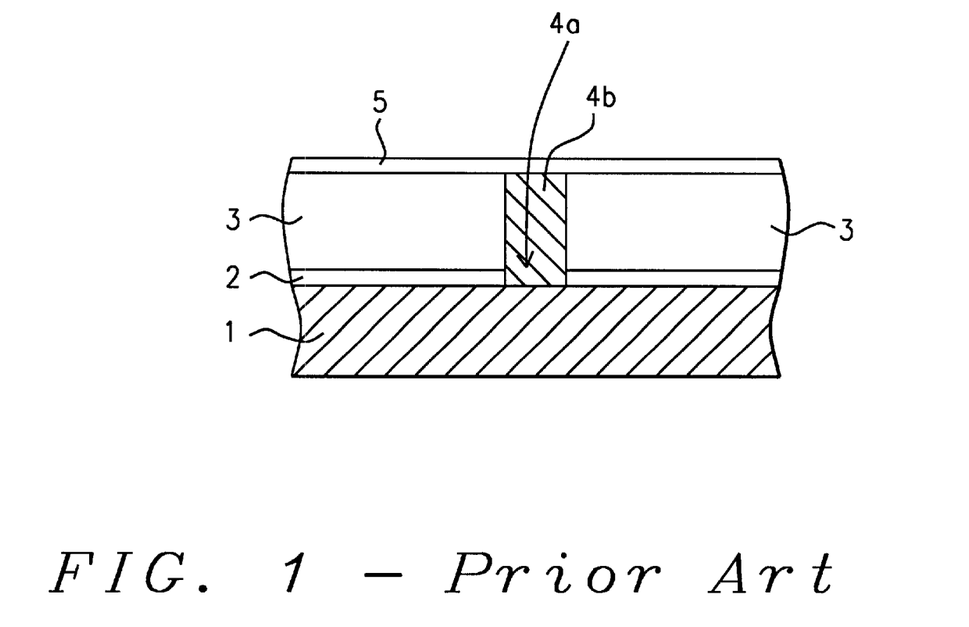
FIGS. 1–4, 5A, 5B, 6A, 6B, and 7–12, which schematically, in cross-sectional style, show three iterations of a process used to improve the adhesion between a overlying CVD insulator layer, and an underlying low K material.

Conventional photolithographic and reactive ion etching, (RIE), procedures, using $O_2/C_2F_6$ as an etchant for low K layer 3, and using $CF_4$ as an enchant for insulator layer 2, are used to create via hole 4a, exposing a portion of the top surface of underlying metal interconnect structure 1. After removal of the photoresist shape, used to define via hole 4a, via plasma oxygen ashing and wet cleans, metal plug 4b, is formed in via hole 4a. Metal plug 4b, can be comprised of copper, using a tantalum—tantalum nitride, composite adhesive and barrier layer, coating the sides of via hole 4a, prior to deposition of copper. Metal plug 4b, can also be comprised of tungsten, or aluminum copper, if desired. The metal layer, used for metal plug 4b, deposited via CVD procedures, to a thickness between about 4000 to 10000 Angstroms, completely filling via hole 4a, followed by removal of unwanted metal, from the top surface of low K layer 3, via a chemical mechanical polishing, (CMP), procedure. Insulator 5, comprised of silicon oxide, or silicon nitride, obtained via LPCVD or PECVD procedures, is next deposited at a thickness between about 500 to 1000 Angstroms. The results of these procedures are schematically shown in FIG. 1.

Figure 2:
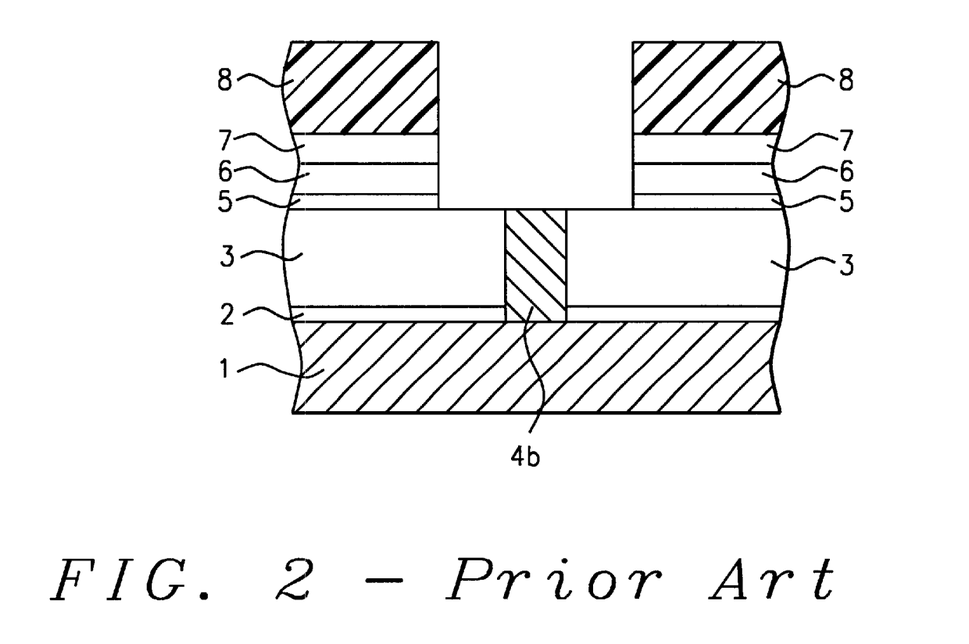
Figure 3:
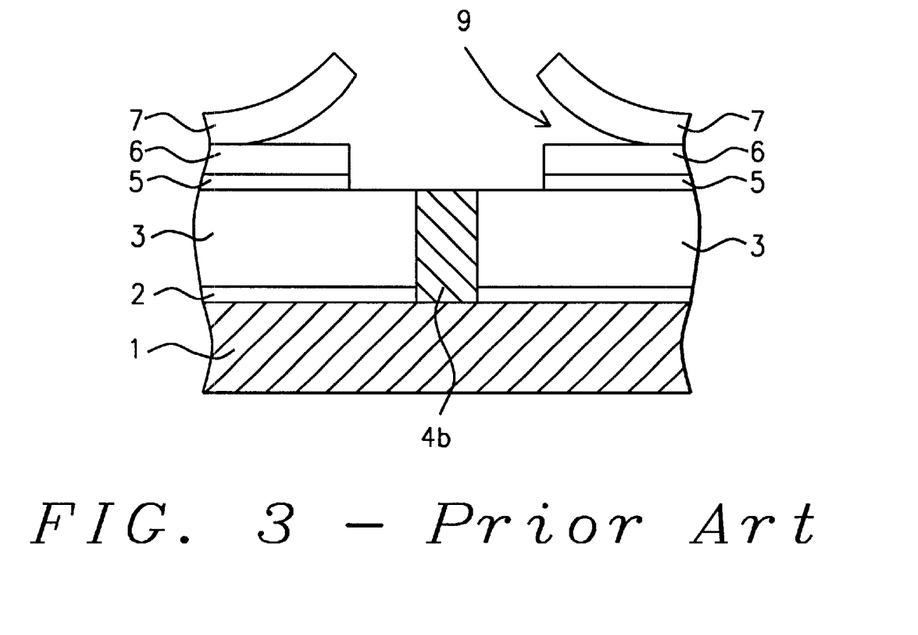
Figure 4:
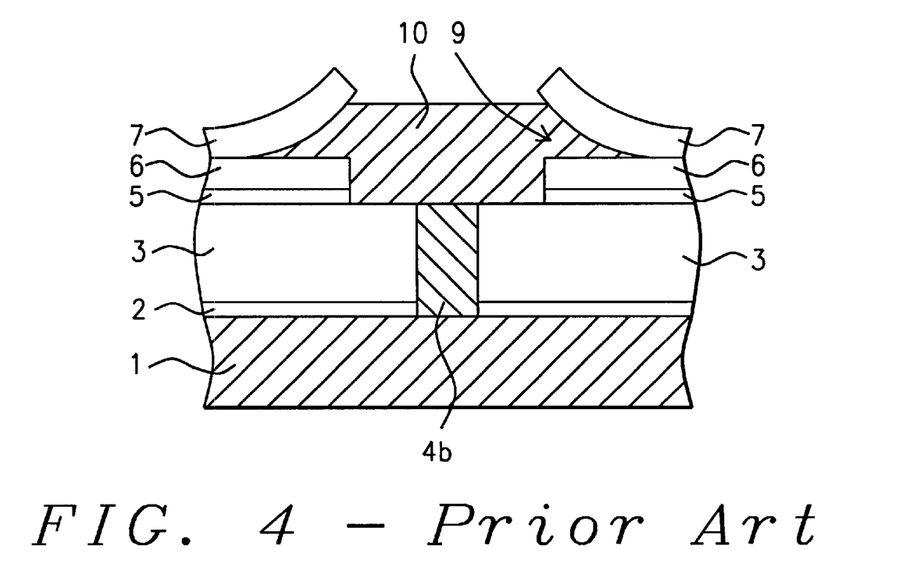

A composite layer, to be used for the damascene mask pattern, is next formed, and addressed schematically in FIG. 2. A low K layer 6, such as FSG, HSQ, or an aromatic hydrocarbon, is first formed on insulator layer 5, using either a CVD, or a spin-on procedure, at a thickness between about 500 to 1000 Angstroms. Low K layer 6, with a dielectric constant between about 2.5 to 3.5, will offer less capacitance then silicon oxide counterparts, and thus result in performance increases, when compared to damascene structures, formed using higher K materials. An overlying insulator layer 7, comprised of silicon oxide, or silicon nitride, is then deposited via LPCVD or PECVD procedures, at a thickness between about 500 to 1000 Angstroms. Photoresist shape 8, is then used as a mask, to allow an anisotropic RIE procedure, using $CHF_3$ or $CF_4$ as an etchant, for insulator layer 7, while using $O_2/C_2F_6$ as an etchant for low K layer 6, creating the composite damascene mask pattern, shown schematically in FIG. 2, comprised of insulator layer 7, on underlying low K layer 6. The region of insulator layer 5, exposed in the opening in the composite damascene mask pattern is also removed during this RIE procedure, via the use of $CF_4$ as an etchant, exposing the top surface of metal plug structure 4b.

The removal of photoresist shape 8, is next addressed. This critical step is performed using plasma oxygen ashing, and wet cleans, comprised of an amine solution, such as ACT690. The use of the wet removal procedure, for photoresist shape 8, results in a loss of adhesion between overlying insulator layer 7, and underlying low K layer 6, creating unwanted interface 9, schematically shown in FIG. 3. Subsequent formation of overlying metal interconnect structure 10, via deposition of a metal layer, such as a copper layer, a tungsten layer, or an aluminum based layer, followed by the removal of unwanted metal, from the top surface of insulator layer 7, via chemical mechanical polishing, (CMP), or RIE procedures, can result in deleterious phenomena, such as bridging between the metal interconnect structure 10, shown schematically in FIG. 4, and neighboring metal interconnect structures, (not shown in FIG. 4). In addition to the adhesion loss between insulator layer 7, and low K layer 6, a loss of adhesion between insulator layer 5, and low K layer 3, can also occur as a result of the wet clean procedure, using an amine type solution.

Figure 5A:
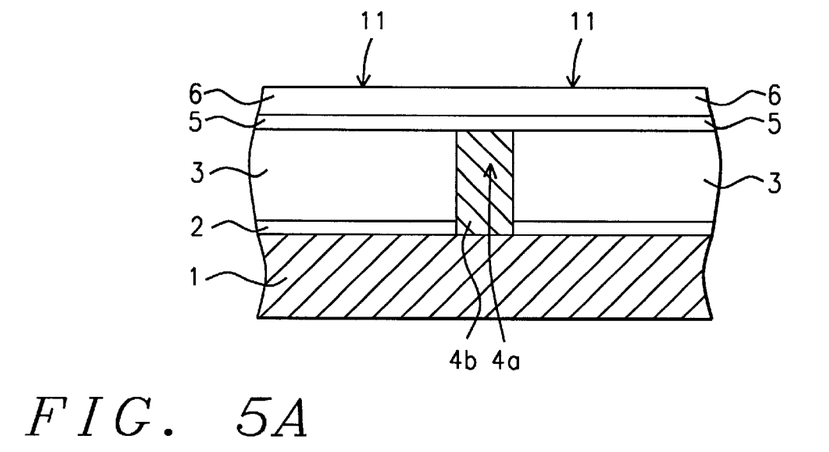
Figure 5B:
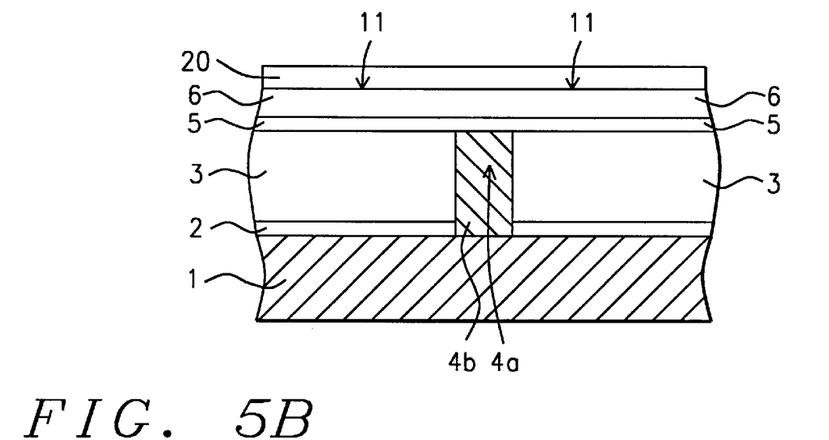
Figure 6A:
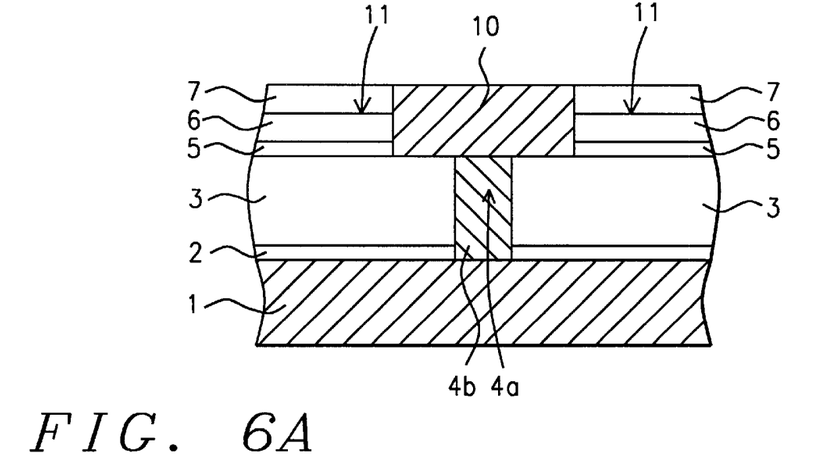
Figure 6B:
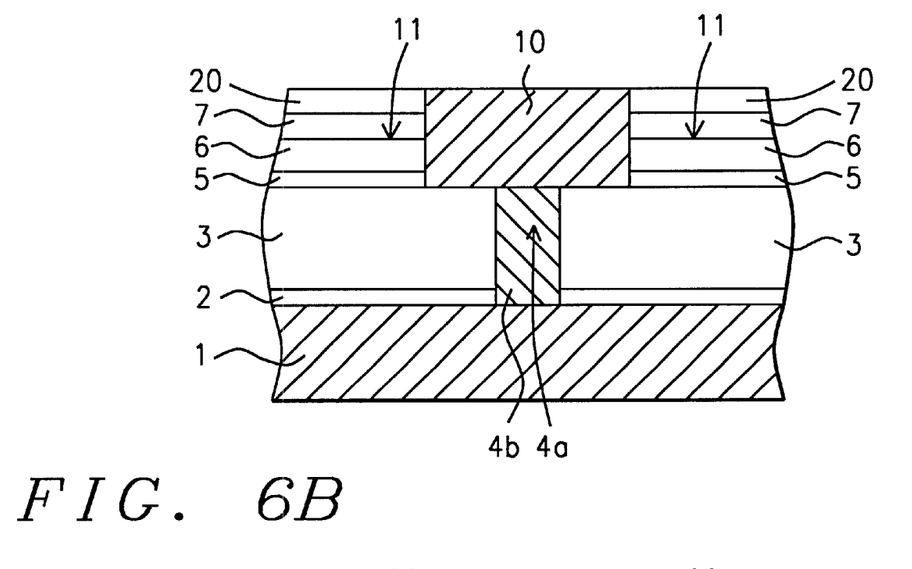

Methods used to improve the adhesion between chemically vapor deposited, (CVD), insulator layers, and low K layers, specifically during the wet stripping of a photoresist shape, used to define a damascene mask, will now be described in detail. FIGS. 5–6, describe a first approach, used to alleviate the adhesion problem, encountered during the photoresist stripping procedure. FIG. 5, again shows metal plug structure 4b, in via hole 4a, covered by insulator layer 5, again comprised of either silicon oxide, or silicon nitride. Low K layer 6, chosen from a group containing FSG, HSQ, or an aromatic hydrocarbon, is deposited on insulator 5, via a CVD procedure, or via a spin-on procedure, to a thickness between about 500 to 1000 Angstroms, and with a dielectric constant between about 2.5 to 3.5. A critical treatment is next performed to the top surface of low K layer 6, creating a roughened top surface 11, for low K layer 6. The treatment is comprised of subjection to an aqueous solution of $NH_4OH$, at a temperature between about 25 to 50° C., for a time between about 4 to 6 mins. The roughened top surface 11, of low K layer 6, can also be accomplished via UV curing procedure, performed in air, at a temperature between about 110 to 200° C., for a time between about 1 to 3 mins. In addition, applications comprised of depositing a silicon rich, silicon oxynitride layer, can also result in the desired roughened surface 11, shown schematically in FIG. 5.

After treatment of low K layer 6, the process continues with the deposition of insulator layer 7, shown schematically in FIG. 6, again either comprised of silicon oxide, or silicon oxide, obtained via LPCVD or PECVD procedures, at a thickness between about 3000 to 5000 Angstroms. A photoresist shape, (not shown in FIG. 6), is used as an etch mask, to allow an anisotropic RIE procedure, using $CF_4$, or $CHF_3$, as an etchant for insulator layer 7, and for insulator 5, and $O_2/C_2F_6$, as an etchant for low k layer 6, to define the composite layer, damascene mask pattern, and to remove the region of insulator 5, exposed in the opening in the damascene mask pattern. Removal of the defining photoresist layer, using plasma oxygen, and wet strippers, such as an amine solution, performed at a temperature between about 100 to 115° C., does not result in an adhesion loss, at interface of insulator layer 7, and low K layer 6, as a result of roughened surface 11, that was created on low K layer 6, using the specific described treatments. Creation of overlying metal interconnect structure 10, shown schematically in FIG. 6, via metal deposition, of a copper, a tungsten, or an aluminum based layer, is followed by removal of unwanted metal from the top surface of insulator layer 7, using CMP or RIE procedures, is accomplished without the metal bridging phenomena, observed with the poor adhesion counterparts.

Figure 7:
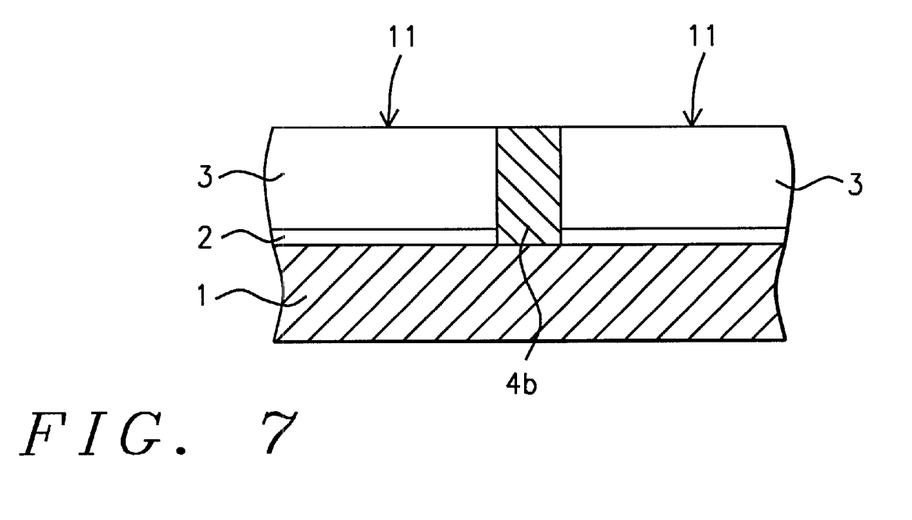
Figure 8:
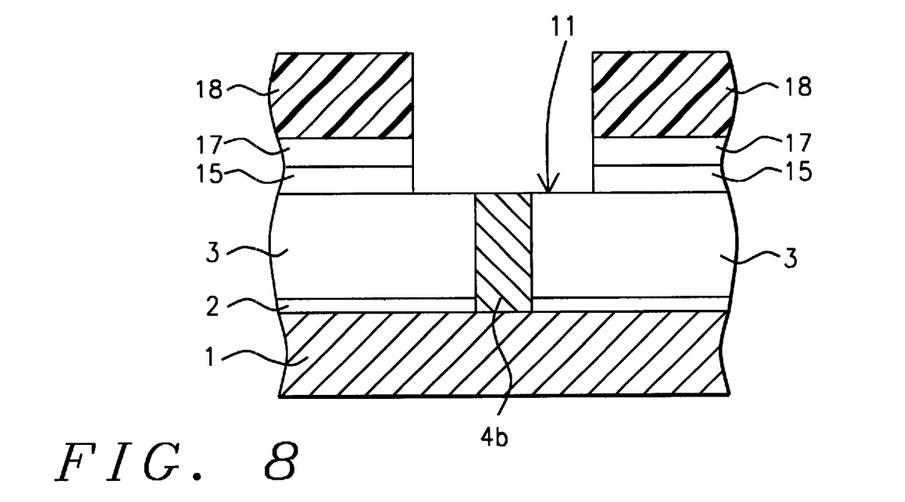
Figure 9:
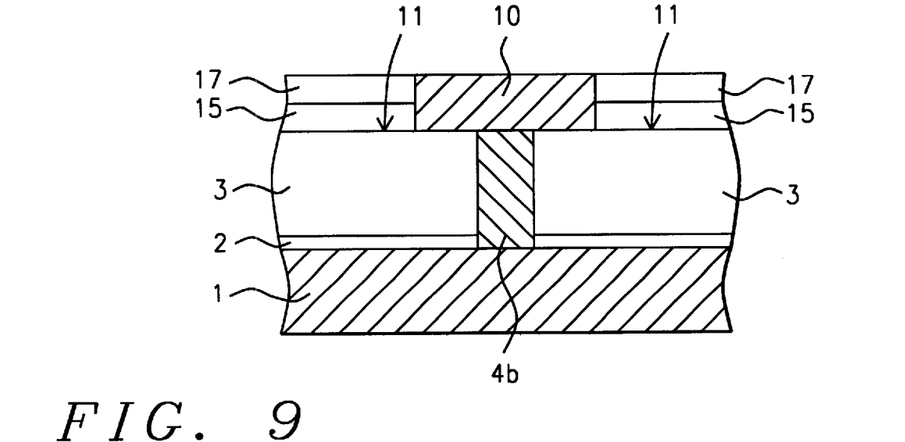

A second approach, used to avoid deleterious adhesion loss between CVD insulator layers, and underlying low K layers, is described schematically using FIGS. 7–9. For this iteration the treatment, regarding $NH_4OH$, or UV curing, or deposition of a silicon rich, silicon oxynitride layer, is performed to thick low K layer 3, (either FSG or HSQ, at a thickness between about 3000 to 5000 Angstroms, with a dielectric constant between about 2.5 to 3.0), creating roughened surface 11, for the top surface of low K layer 3, shown schematically in FIG. 7. Insulator layer 15, comprised of silicon oxide, or silicon nitride, at a thickness between about 500 to 1000 Angstroms, is obtained via LPCVD or PECVD procedures, followed by the deposition of insulator layer 17, comprised of silicon oxide, at a thickness between about 3000 to 5000 Angstroms, again obtained via LPCVD or PECVD procedures. A photoresist shape 18, is used as a mask to allow an anisotropic RIE procedure, using $CHF_3$, or $CF_4$, as an etchant, to create a damascene mask pattern, in insulator layer 17, while also removing the region of insulator layer 15, exposed, in the opening, in the damascene mask pattern. This is schematically shown in FIG. 8.

Removal of photoresist shape 18, using plasma oxygen ashing, and wet strippers, such as a amine solution, does not result in adhesion loss between the overlying insulator layer, and low k layer 3, as a result of treated surface 11. Overlying metal interconnect structure 10, schematically shown in FIG. 9, formed using the identical processed previously described for the first approach, does not result in the deleterious bridging phenomena, encountered with poor adhering damascene mask patterns.

Figure 10:
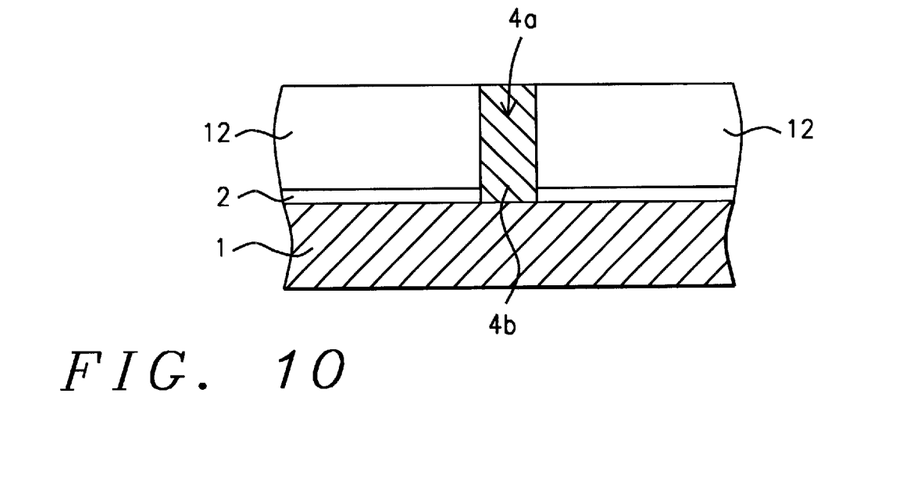
Figure 11:
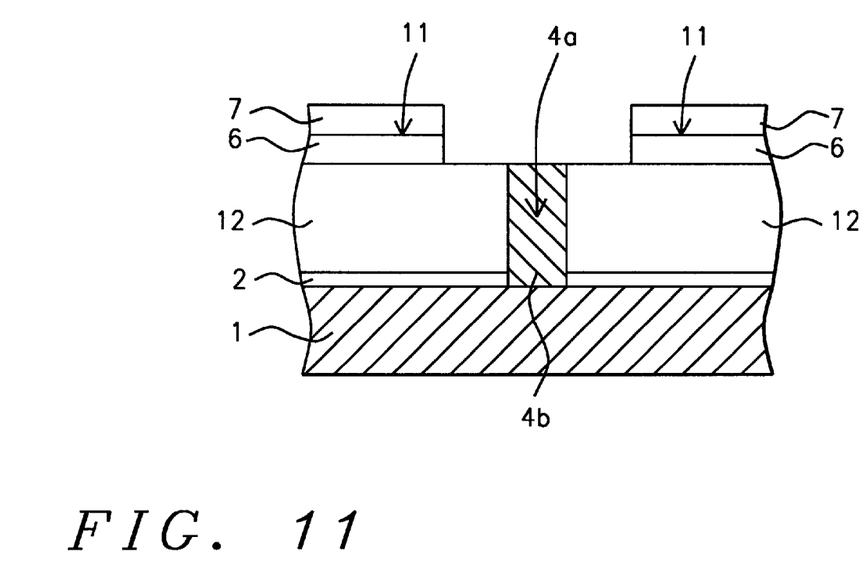
Figure 12:
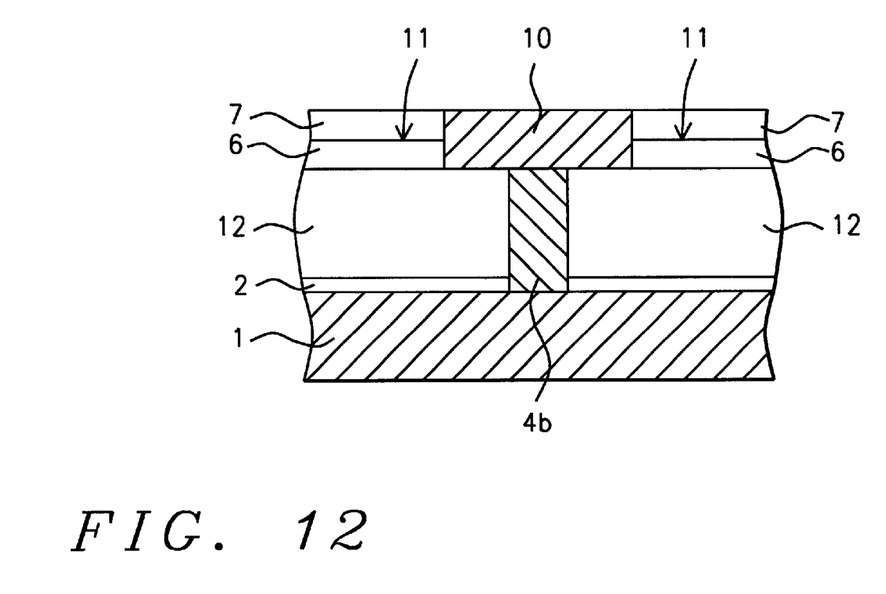

A third iteration of this invention is described schematically using FIGS. 10–12. In this iteration a thick silicon oxide layer 12, at a thickness between about 3000 to 5000 Angstroms, obtained via LPCVD or PECVD procedures, is used as the interlevel dielectric layer, unlike the use of the low k layer, used with the previous iterations. Conventional photolithographic and anisotropic RIE procedures, using $CHF_3$ as an etchant for silicon oxide layer 12, while using $CF_4$ as an etchant for silicon nitride, insulator layer 2, are used to create via hole 4a, exposing the top surface of underlying metal interconnect structure 1. Removal of the photoresist shape, used for definition of via hole 4a, is accomplished using plasma oxygen ashing and careful wet cleans. Metal plug structure 4b, shown schematically in FIG. 10, is formed in via hole 4a, the identical materials, and processes, described for the previous iterations.

Low K layer 6, again comprised of either FSG, HSQ, or an aromatic hydrocarbon, at a thickness between about 500 to 1000 Angstroms, an with a dielectric constant between about 2.5 to 3.0, is obtained via a CVD procedure, or via a spin-on procedure. The treatment of either $NH_4OH$, UV, or the deposition of the silicon rich, silicon oxynitride layer, results in the desired roughened surface 11, of low K layer 6. Subsequent deposition of insulator layer 7, either silicon oxide, or silicon nitride, via PECVD procedures, at a thickness between about 1000 to 2000 Angstroms, is next accomplished. Photolithographic and anisotropic RIE procedures, using $CF_4$ or $CHF_3$ as an etchant for insulator layer 7, and $O_2/C_2F_6$ as an etchant for low K layer 6, are used to define the composite layer, damascene mask pattern, comprised of insulator layer 7, and low k layer 6, exposing the top surface of metal plug 4b. Removal of the photoresist shape, used to define the composite insulator, damascene mask pattern, is accomplished using plasma oxygen ashing, and a wet strip, in an amine solution. This procedure is accomplished without adhesion degradation at the interface between insulator layer 7, and low K layer 6, as a result of the roughened surface 11, of low K layer 6. This is schematically shown in FIG. 11. FIG. 12, schematically shows the creation of overlying metal interconnect structure 10, in the opening in the damascene mask pattern, without bridging of overlying metal interconnect structure 10, which would have occurred if an adhesion loss, between layers of the damascene mask pattern had occurred.

While this invention has been particularly shown and described with reference to the preferred embodiments thereof, it will be understood by those skilled in the art that various changes in form and details may be made without departing from the spirit or scope of this invention.

What is claimed is:

1. A method of fabricating a metal interconnect structure, on a semiconductor substrate, using a silicon oxide, damascene mask pattern, formed on underlying thick low K—insulator, composite layer, and featuring a UV treatment performed on said thick low K layer, prior to deposition of the said silicon oxide layer, used for the damascene mask pattern, with said UV treatment used to improve the adhesion between said silicon oxide layer, and said thick low K layer, comprising the steps of:

forming said thick low K layer, and an underlying insulator layer, on an underlying, first metal interconnect structure;

forming a via hole in said thick low K layer, and in said underlying insulator layer, exposing a portion of the top surface, of said first metal interconnect structure;

forming a metal plug structure, in said via hole;

performing said treatment, comprised of UV exposure of the top surface of said thick low k layer, creating a roughened top surface for said thick low K layer;

depositing a second insulator layer, on said roughened top surface of said thick low K layer;

depositing a silicon oxide layer on said second insulator layer;

using a photoresist shape, with a first opening, as a mask, to form said silicon oxide, damascene mask pattern, via removal of regions of said silicon oxide layer, exposed in said first opening in said photoresist shape, and with a second opening, in said silicon oxide, damascene mask pattern, exposing a portion of the top surface of said second insulator layer;

removing said portion, of said second insulator layer, exposed in said second opening, in said silicon oxide, damascene mask pattern, exposing the top surface of said metal plug structure;

removing said photoresist shape, from the top surface of said silicon oxide, damascene mask pattern; and forming a second metal interconnect structure, in said second opening, in said silicon oxide, damascene mask pattern.

2. The method of claim 1, wherein said thick low K layer, is chosen from a group that includes, FSG or HSQ, obtained via a PECVD procedure, for said FSG layer, and via a spin-on procedure, for said HSQ layer, both at a thickness between about 3000 to 5000 Angstroms, and both with a dielectric constant between about 2.5 to 3.5.

3. The method of claim 1, wherein said second insulator layer, is a silicon oxide, or a silicon nitride layer, obtained via PECVD procedures, at a thickness between about 500 to 1000 Angstroms.

4. The method of claim 1, wherein said silicon oxide layer is obtained via PECVD procedures, to a thickness between about 3000 to 5000 Angstroms.

5. The method of claim 1, wherein said silicon oxide, damascene mask pattern, is formed via an anisotropic RIE procedure, using $CHF_3$, or $CF_4$ as an etchant, and using said first opening, in said photoresist shape as a mask.

6. The method of claim 1, wherein said photoresist shape is removed via plasma oxygen ashing and via use of a wet stripper, such as an amine solution, performed at a temperature between about 100 to 115° C.

* * * * *